Figure 1:
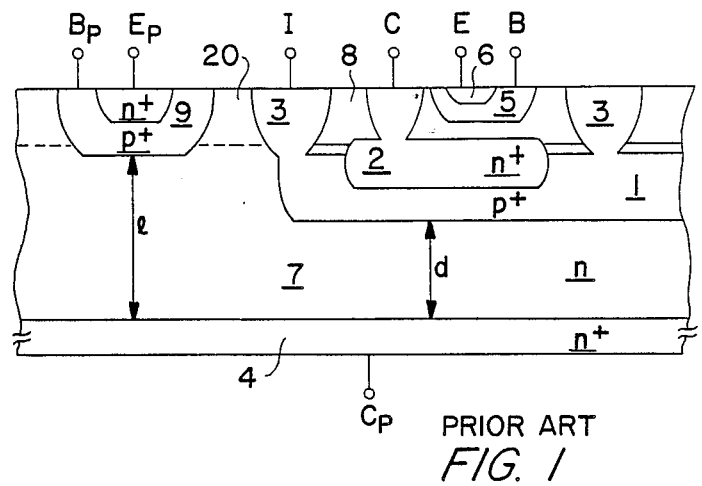

United States Patent [19]

Zambrano et al.

[11] Patent Number: 4,965,215
[45] Date of Patent: Oct. 23, 1990

[54] MANUFACTURING PROCESS FOR A MONOLITHIC SEMICONDUCTOR DEVICE COMPRISING AT LEAST ONE TRANSISTOR OF AN INTEGRATED CONTROL CIRCUIT AND ONE POWER TRANSISTOR INTEGRATED ON THE SAME CHIP

[75] Inventors: Raffaele Zambrano, Mercato San Severino; Salvatore Musumeci, Riposto, both of Italy

[73] Assignee: SGS-Thomson Microelectronics S.r.L., Brianza, Italy

[21] Appl. No.: 287,067

[22] Filed: Dec. 21, 1988

[30] Foreign Application Priority Data

Dec. 22, 1987 [IT] Italy .................. 6630 A/87

[51] Int. Cl.$^5$ ...................... H01L 21/331
[52] U.S. Cl. ..................... 437/31; 437/51; 437/59; 437/74; 437/151; 437/228
[58] Field of Search ............ 437/30, 31, 51, 59, 437/74, 151, 228; 357/23.4; 148/DIG. 90, DIG. 167, DIG. 151

[56] References Cited

U.S. PATENT DOCUMENTS

| | | | |
|---|---|---|---|
| 3,481,801 | 12/1969 | Hugle | 437/31 |
| 3,956,035 | 5/1976 | Herrmann | 437/74 |
| 4,032,372 | 6/1977 | Vora | 437/74 |
| 4,054,899 | 10/1977 | Stehlin et al. | 437/74 |
| 4,404,048 | 9/1983 | Vogelsang | 437/74 |
| 4,483,738 | 11/1984 | Blossfeld | 437/31 |
| 4,721,684 | 1/1988 | Musumeci | 437/30 |
| 4,780,430 | 10/1988 | Musumeci et al. | 437/31 |
| 4,826,780 | 5/1989 | Talcemoto et al. | 437/59 |

Primary Examiner—Brian E. Hearn
Assistant Examiner—Tom Thomas

[57] ABSTRACT

The device uses the horizontal insulating region and the buried layer as the power transistor base and emitter respectively. An epitaxial growth is interposed between the two diffusions needed to form the aforesaid regions and those needed to create the base and the emitter of the transistor of the integrated control circuit.

2 Claims, 5 Drawing Sheets

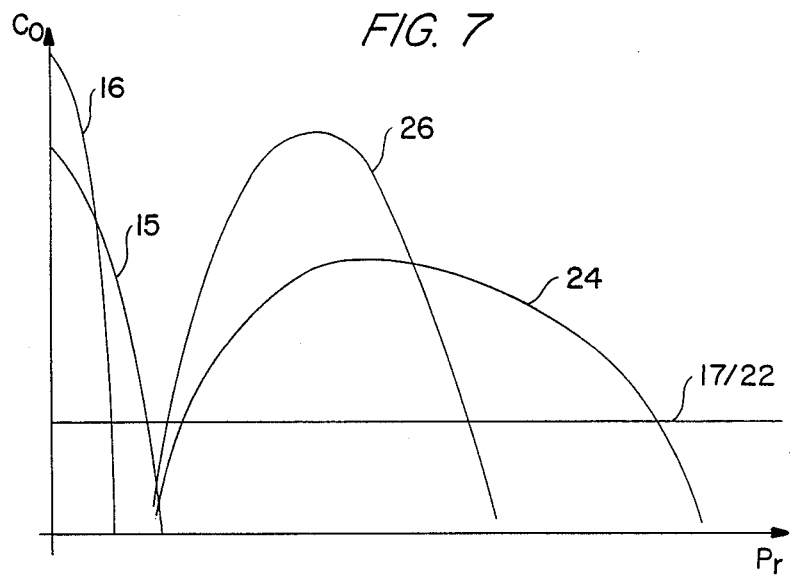
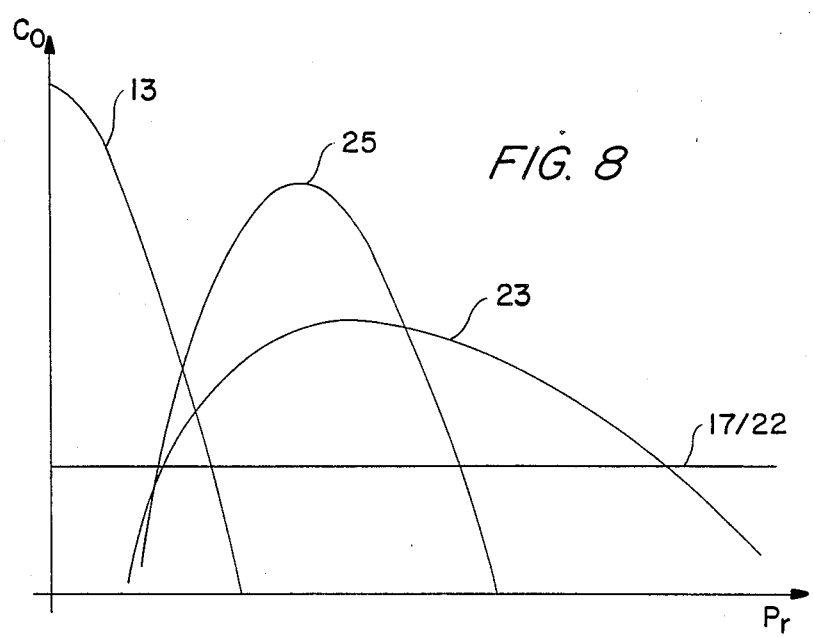

MANUFACTURING PROCESS FOR A MONOLITHIC SEMICONDUCTOR DEVICE COMPRISING AT LEAST ONE TRANSISTOR OF AN INTEGRATED CONTROL CIRCUIT AND ONE POWER TRANSISTOR INTEGRATED ON THE SAME CHIP

This invention concerns a manufacturing process for a monolithic semiconductor device comprising at least one transistor of an integrated control circuit and one power transistor integrated on the same chip.

The association of vertical flow high voltage power transistors and an integrated control circuit on the same chip results in an extremely compact and efficient device with advantages over those using separate components.

In said device the distance between the lower margin of the horizontal insulating region and the underlying substrate cannot fall below a certain limit d, the value of which depends on the operating voltage of the device. The current rating of the power stage, on the other hand, will rise in proportion to the decrease in thickness of the collector and therefore reaches the maximum permissible value when the thickness reaches the minimum level d permitted by the operating voltage. It is therefore advantageous for the device to be made in such a way that the depth of the junction of the horizontal insulating region and that of the base of the power transistor coincide.

An attempt to solve the aforesaid problem is represented by the procedure described in the U.S. Pat. No. 4,239,558 which, however, involves very heavy doping in the base and emitter regions of the integrated control circuit transistor, resulting in the lowering of the relative break-down values of the junctions of the integrated control circuit transistors and between the collectors of the latter and the horizontal insulating region. The scope of the invention is to provide a manufacturing process for a semiconductor device of the above-described type, by means of which it is possible to maximize the current rating of the power stage and the operating voltage of the integrated control circuit. For this purpose, the process comprises the following phases:

the epitaxial growth on a semiconductor substrate (11) of a first type of conductivity, of a semiconductor layer (22) which is also of the aforesaid first type of conductivity;

the simultaneous formation, by diffusion of doping agent within the surface of the layer (22), of a first semiconductor region (23) and a second semiconductor region (24) of a second type of conductivity, said first region (23) constituting the base region of the power transistor, said second region (24) constituting the horizontal insulating region of the integrated control circuit with respect to the power transistor;

the simultaneous formation, by diffusion within the surface of the aforesaid regions (23) and (24), of two regions (25) and (26), respectively, of the first type of conductivity, constituting, respectively, the emitter region of the power transistor and the buried layer of the collector region of the integrated control circuit transistor;

the formation, by further subsequent superficial diffusions, of the base (15) and the emitter (16) of the aforesaid transistor of the integrated control circuit;

the formation, by simultaneous diffusion, of connecting regions (21) and (19), at the surface (12) of the horizontal insulating region (24) and base region (23) of the power transistor, respectively;

the formation, by simultaneous diffusion, of enrichment regions (13) and (14) for the emitter (25) of the power transistor and the buried layer (26) of the integrated control circuit transistor, respectively;

and is characterized by the fact that the formation of the regions (21), (19), (13) and (14) of the base (15) and of the emitter (16) of the transistor of the integrated control circuit is preceded by the epitaxial growth of a semiconductor layer (17) of the first type of conductivity.

Figure 2:
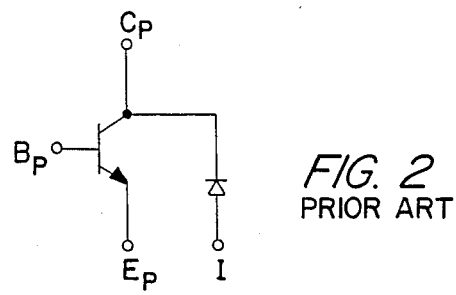
Figure 3:
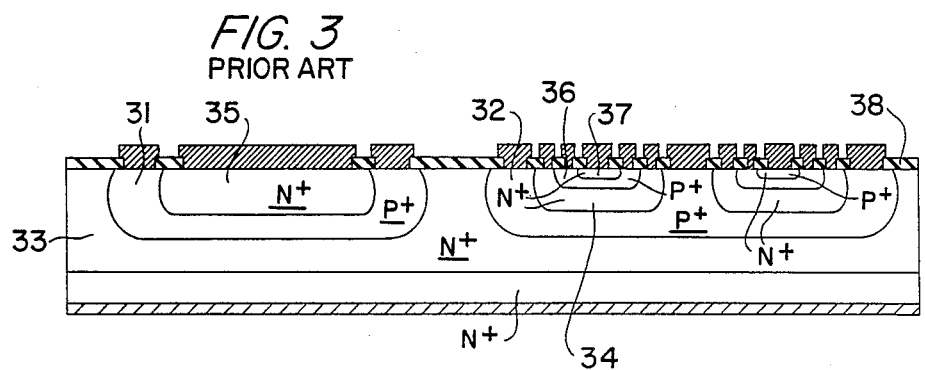
Figure 4:
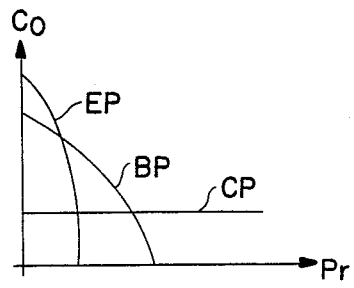
Figure 5:
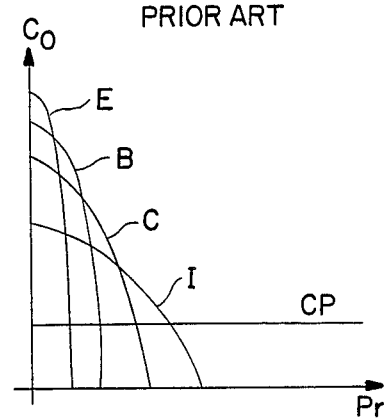
Figure 6:
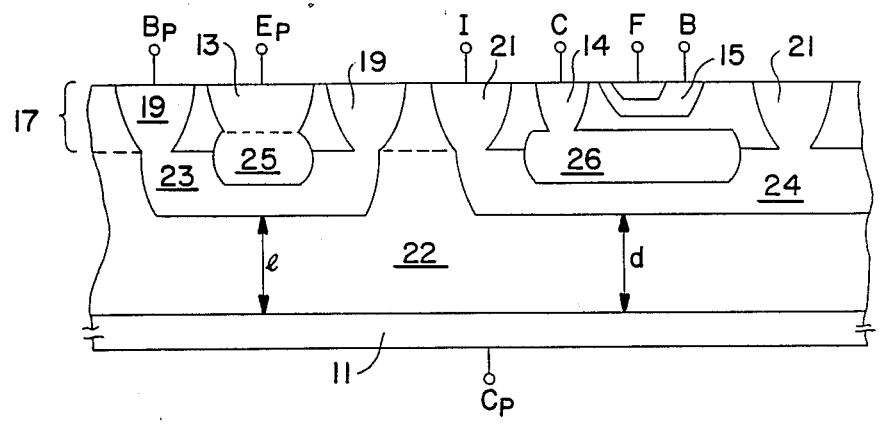
Figure 9:
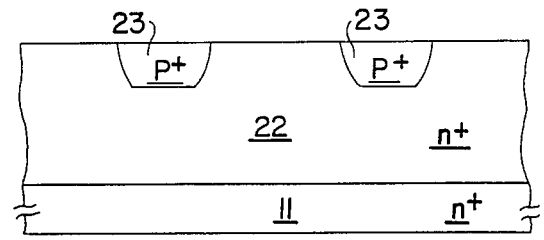

The features of the invention will be more clearly evident from the following description and accompanying drawings of a non-restrictive embodiment in which:

FIG. 1: shows a typical structure of a known type of monolithic semiconductor device;

FIG. 2: shows the electrical equivalent of the structure of the power transistor and of the insulating region of FIG. 1;

FIG. 3: shows a known type of structure with identical depth of the base junction of the power transistor and of the lower margin of the horizontal insulating region;

FIG. 4: shows a schematic representation of the profile of the concentrations of the various types of doping agent along the emitter, base and collector regions of the power transistor of FIG. 3;

FIG. 5: shows a schematic representation of the profile of the concentrations of the various types of doping agent along the emitter, base and collector regions of the transistor of the integrated control circuit, the horizontal insulating region and the collector of the power transistor of FIG. 3;

FIG. 6: shows a schematic representation of the structure of a semiconductor device according to the invention;

FIG. 7: shows the profile of the various types of doping agent along a section of the structure of FIG. 6 passing through the emitter, base and collector regions of the transistor of the integrated control circuit, the horizontal insulating region and the epitaxial collector of the power transistor;

FIG. 8: shows the profile of the concentrations of the various types of doping agent along a section passing through the emitter, base and epitaxial collector regions of the power transistor of FIG. 6;

FIGS. 9, 10, 11, 12 and 13: show a schematic representation of the structure of the device according to the invention during the various phases of the manufacturing process.

In the known type of integrated circuit of FIG. 1, C, E and B represent the collector, emitter and base electrodes of a low-voltage npn transistor of the integrated control circuit, while Cp, Ep and Bp represent the collector, emitter and base electrodes of a high-voltage npn power transistor.

The device is capable of operating correctly if the p type insulating region, which is made up of the regions 1 and 3, is connected to the point of the device with the lowest potential.

According to this hypothesis, on observing FIG. 2 (that is to say, the electrical equivalent of the structure) it can be seen that the diode having as its anode the insulating regions 1 and 3 and as its cathode the collector region 7 of the power transistor is reverse biased and consequently the components of the integrated control circuit are insulated from each other and from the power stage. This circumstance enables the device to operate. On the other hand, the distance d between the lower margin of the insulating region 1 and the substrate 4 is smaller than the distance 1 between the lower margin of the base region 9 of the power transistor and the substrate itself: the result of this is that the break-down voltage of the aforementioned diode is lower than the break-down voltage of the power transistor and consequently the peak operating voltage of the device is established by the first of them rather than by the second.

When designing a device, the thickness d must be fixed so that it enables the required peak voltage to be stood. Vice versa, the current rating of the power stage depends on the collector thickness (and therefore on l) according to the law of reverse proportion. Since said current rating is penalized by the difference s ($=1-d$) between the junction depth of the base of the power transistor and that of the horizontal insulating region 1, it is necessary to reduce this difference to a minimum (and if possible to zero). In order to do so, it could be considered expedient to increase the junction depth of the base of the power transistor by increasing the diffusion times and/or temperatures; however this gives rise to two problems:

(1) the p type doping agent contained in the horizontal insulating region 1 could rise to the surface 8 faster than the n type doping agent present in the buried layer 2 and could therefore create "phantom" layers of a conductivity opposite to that which should exist in the collector region of an npn transistor;

(2) the n type doping agent contained in the buried layer 2 could rise to the surface 8 and alter the profile of the base region 5 of the low voltage npn transistor and, in the worst hypothesis, short circuit the emitter 6 and collector 2 regions.

It could also be considered expedient to reduce the thickness of the last epitaxial layer 20: this solution involves the same risk described in the aforegoing paragraph 2) and, in any case, would mean reducing the ultimate working voltage for the components of the integrated control circuit.

Another attempt to solve this problem is the one described in the U.S. Pat. No. 4,239,558, which refers to a structure of the type illustrated in FIG. 3, wherein, however, a number of problems can be identified, the most serious of which concerns the limitation of the voltage at which the integrated control circuit can operate.

In fact, the concentration profile of the various types of doping agent along the emitter 35, base 31 and epitaxial collector 33 regions of a power transistor made according to the process relating to the structure of FIG. 3, is schematically illustrated in FIG. 4. The concentrations, in logarithmic scale, are measured on the axis Co of the figure, whereas the distances (depth) of the points of the various regions from the upper surface 38 of the chip are measured on the axis Pr.

Curves EP, BP and CP refer to the doping agent used for the emitter, the base and the collector epitaxial region of the transistor respectively. The surface concentration of the curve EP must be approximately two orders of magnitude greater (or in other words approximately $10^2$ times greater) than that of the curve BP in order to achieve a reasonable degree of emitter efficiency and in turn BP must be approximately three orders of magnitude greater (or in other words approximately $10^3$ times greater) than that of the curve CP so that the drain region essentially extends to the collector epitaxial region (necessary conditions for achieving a high early voltage and avoiding punch-through).

If then the collector epitaxial region has a concentration of impurities equal to $10^{14}$ atoms/cm$^3$ (the value needed to achieve break-downs not less than approximately 1000 volts), the surface concentrations for the curves EP and BP must be in the order of $10^{19}$ and $10^{17}$ atoms/cm$^3$ respectively.

Referring to FIG. 3 again, the base region 36 of the transistor of the integrated control circuit must have a concentration higher than that of the collector region 34 and lower than that of the emitter region 37. Since the collector region of the transistor of the integrated control circuit is made at the same time as the emitter region of the power transistor, the doping of the base and emitter regions of the transistor of the integrated control circuit must be very high, close to the solid solubility limits of the various impurities in question. In FIG. 5 the curves E, B, C, I and CP show the resulting concentration profile of the various doping impurities along the emitter, base and collector regions of the transistor of the integrated control circuit, along the horizontal insulation region 32 and the collector epitaxial region 33.

The break-down values of the emitter-base and base-collector junctions of the transistor of the integrated control circuit, as well as of the junction between the collector of the latter and the horizontal insulation region are extremely low as a result of the aforesaid high doping. They can be increased only if the concentrations are reduced, which would immediately downgrade performance.

The solution according to this invention makes it possible to overcome these problems by means of a structure which uses the horizontal insulation region and the buried layer as the base and the emitter of the power transistor respectively, as shown in FIG. 6 (where the symbols have the same meaning as the same symbols used in FIG. 1), interposing however an epitaxial growth of the n type (see layer marked 17 in FIG. 6) between the two said diffusions and those needed to create the base and the emitter of the transistors of the integrated control circuit.

One of the peculiarities of the structure is that $1=d$, since the base of the power transistor and the horizontal insulation region are made by means of the same diffusion process: the current rating of the device can therefore be kept at its maximum value once the operating voltage has been fixed. In order to analyze how the structure according to the invention overcomes the problems of the known art (in particular those found in the structure shown in FIG. 3), reference must be made to FIGS. 7 and 8.

The first shows the profile of the concentration of doping agent along one section of the structure of FIG. 6 passing through the emitter region 16, base region 15 and collector region 26 of the transistor of the integrated control circuit, the horizontal insulation region 24 and finally the epitaxial collector region 22 of the power transistor, while the second refers to a cross section through regions 13 and 25 of the emitter, region 23 of the base and epitaxial collector of the power transistor.

The ratios between the concentrations of doping agent in the emitter, base and collector regions of the power transistor and the transistor of the integrated control circuit are satisfactory inasmuch as an epitaxial growth is realized following the creation of the horizontal insulation region and the buried layer and prior to the diffusion of the base and emitter regions of the transistor of the integrated control circuit. Said epitaxial layer separates the two pair of highly doped regions (see FIG. 7) and thus allows the integrated control circuit to operate at sufficiently high voltages.

Since the emitter and base regions of the power transistor are "buried", they must be connected to the surface by means of high concentration "enrichment" regions so as to reduce the series-resistances of the base and the emitter: to this end the insulation (region 19 of the base) and sinker (region 13 of the emitter) regions are used without modifying the manufacturing process, simply by using a different photomask layout.

One method of manufacturing the invention is described below.

An epitaxial layer 22 of the type n− with a concentration of impurities of approximately $10^{14}$ atoms/cm$^3$ is grown on a substrate 11 of monocrystalline silicon type n+ with a high concentration of impurities (concentration > $10^{19}$ atoms/cm$^3$).

Using the normal oxidation, photomasking, implantation and diffusion techniques two regions 23 and 24 of the type p+ with a surface concentration of approximately $5 \cdot 10^{16}$ atoms/cm$^3$ are created to form the base of the npn power transistor and the horizontal insulation region of the components of the integrated control circuit (FIG. 9) respectively.

Figure 10:
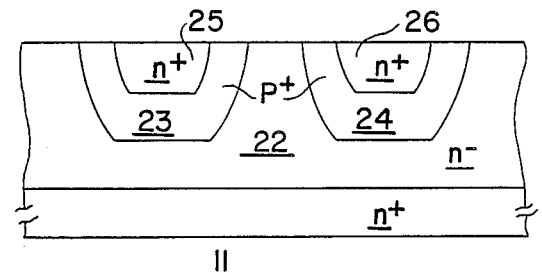

Using normal oxidation, photomasking, implantation and diffusion techniques, two regions 25 and 26 of n+ type are realized inside regions 23 and 24 respectively, with dopant surface concentrations of $2 \cdot 10^{19}$ atoms/cm$^3$, which are destined to become the emitter region of the power transistor and the buried layer of an NPN transistor of the integrate control circuit (FIG. 10).

At this point, by means of a new epitaxial growth, a layer 17 of the n type is obtained, which has a constant dopant concentration of $10^{14}$ atoms/cm$^3$, and extends on all the surface of the chip.

Figure 11:
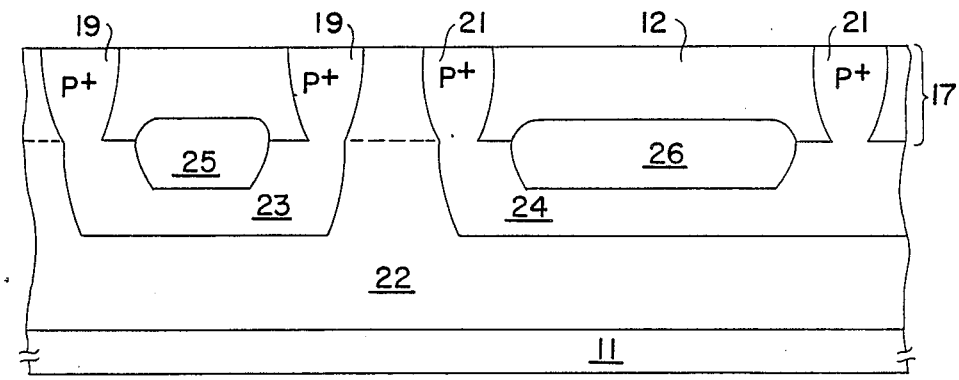

Still using normal oxidation, photomasking, implantation and diffusion techniques regions 19 and 21 of the p+ type with surface concentrations of $10^{18}$ atoms/cm$^3$ are made, stretching from the surface 12 as far as regions 23 and 24 (FIG. 11).

It should be noted that whereas regions 21 constitute the vertical insulation regions needed to insulate the various components of the integrated control circuit from each other and to insulate the circuit itself from the power stage, the "enrichment" regions 19 enable the base region 23 of the power transistor to be connected electrically to the surface.

Figure 12:
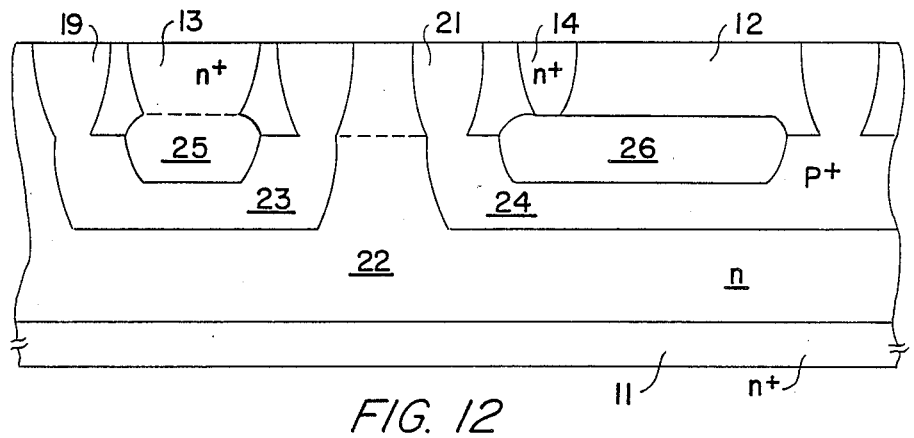
Figure 13:
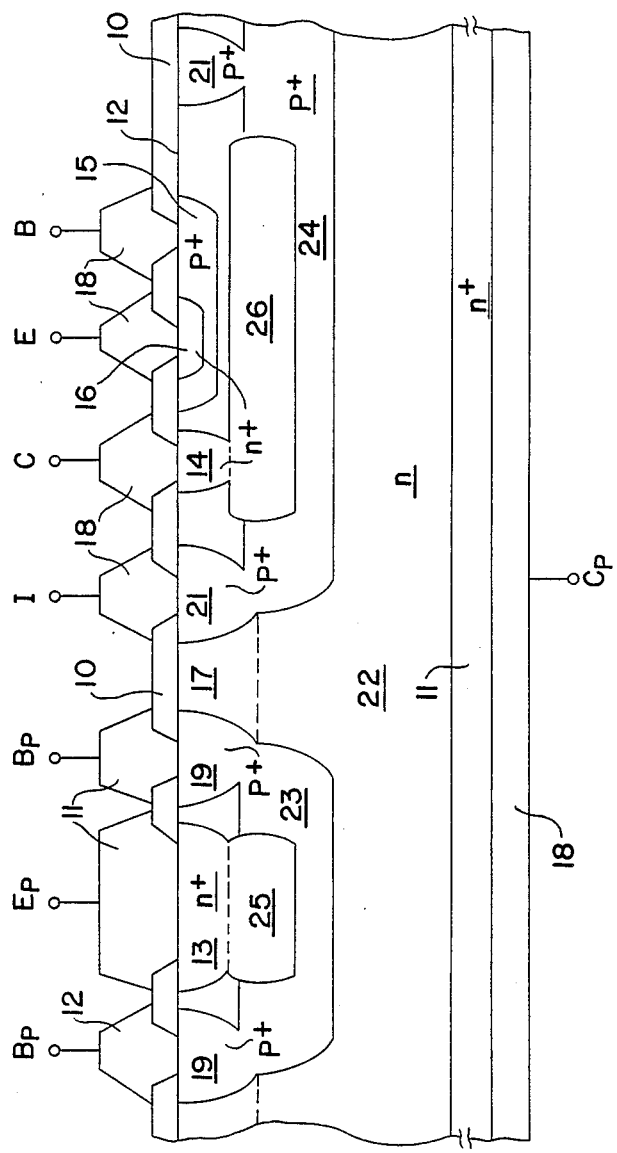

Next the "enrichment" regions 13 and 14 of type n+ are formed with surface concentrations of $2 \cdot 10^{19}$ atoms/cm$^3$, the purpose of which is to reduce the series-resistance of for the emitter of the power transistor and the collector of the low voltage transistor respectively (FIG. 12).

At this point the known techniques (see FIG. 13) are used to form the base 15 and emitter 16 region of the npn low voltage transistor, the aperture of the contacts (see aperture present on the insulating layer 10) and the interconnection of the various elements of the device by means of a process of metal-coating and photomasking (see metal-coatings 18): all the terminal electrodes of the various components are situated on the front of the chip with the exception of the collector of the power transistor which is on the back.

Although only one form of manufacturing process has been illustrated and described, it is clear that numerous variations and modifications can be made to the invention without moving away from its scope.

For example, the epitaxial region 17 can be achieved through a double growth, as described in Italian patent application No. 6613A/86.

The border regions of the base of the power transistor and of the insulation region can be surrounded by other regions having the same type of conductivity.

We claim:

1. A manufacturing process for a monolithic semiconductor device comprising at least one transistor of an integrated control circuit and one power transistor integrated on the same chip, the phases of which envisage:

the epitaxial growth on a semiconductor substrate (11) of a first type of conductivity, of a semiconductor layer (22) which is also of the aforesaid first type of conductivity;

the simultaneous formation, by diffusion of doping agent within the surface of the layer (22), of a first semiconductor region (23) and a second semiconductor region (24) of a second type of conductivity, said first region (23) constituting the base region of the power transistor, said second region (24) constituting the horizontal insulating region of the integrated control circuit with respect to the power transistor;

the simultaneous formation, by diffusion within the surface of the aforesaid regions (23) and (24), of two regions (25) and (26), respectively, of the first type of conductivity, constituting, respectively, the emitter region of the power transistor and the buried layer of the collector region of the integrated control circuit transistor;

the formation, by further subsequent superficial diffusions, of the base (15) and the emitter (16) of the aforesaid transistor of the integrated control circuit;

the formation, by simultaneous diffusion, of connecting regions (21) and (19), at the surface (12) of the horizontal insulating region (24) and base region (23) of the power transistor, respectively;

the formation, by simultaneous diffusion, of enrichment regions (13) and (14) for the emitter (25) of the power transistor and the buried layer (26) of the integrated control circuit transistor, respectively; characterized by the fact that the formation of the regions (21), (19), (13) and (14) of the base (15) and of the emitter (16) of the transistor of the integrated control circuit is preceded by the epitaxial growth of a semiconductor layer (17) of the first type of conductivity.

2. A manufacturing process as claimed in claim 1 characterized by the fact that the region (15) of the base of aforesaid integrated control circuit transistor extends from the surface (12) of aforesaid layer (17) as far as the buried layer (26) of the collector region of said transistor.

* * * * *